(12) United States Patent
Shih et al.

(10) Patent No.: US 10,290,596 B2
(45) Date of Patent: May 14, 2019

(54) SEMICONDUCTOR DEVICE HAVING A PASSIVATION LAYER AND METHOD OF MAKING THE SAME

(71) Applicant: TAIWAN SEMICONDUCTOR MANUFACTURING COMPANY, LTD., Hsinchu (TW)

(72) Inventors: Yu-Lung Shih, Hsinchu (TW); Chao-Keng Li, Jhubei (TW); Alan Kuo, Hsinchu (TW); C. C. Chang, Hsinchu (TW); Yi-An Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/617,405

(22) Filed: Jun. 8, 2017

(65) Prior Publication Data

US 2018/0166406 A1 Jun. 14, 2018

Related U.S. Application Data

(60) Provisional application No. 62/434,243, filed on Dec. 14, 2016.

(51) Int. Cl.
*H01L 23/00* (2006.01)
*H01L 23/31* (2006.01)
*H01L 23/485* (2006.01)
*H01L 21/02* (2006.01)

(52) U.S. Cl.
CPC .......... *H01L 24/03* (2013.01); *H01L 21/0217* (2013.01); *H01L 21/02164* (2013.01); *H01L 21/02271* (2013.01); *H01L 21/02274* (2013.01); *H01L 23/3171* (2013.01); *H01L 23/3192* (2013.01); *H01L 23/485* (2013.01); *H01L 24/11* (2013.01); *H01L 2224/0391* (2013.01); *H01L 2224/1191* (2013.01); *H01L 2924/30205* (2013.01)

(58) Field of Classification Search
None
See application file for complete search history.

(56) References Cited

U.S. PATENT DOCUMENTS

2014/0131861 A1\* 5/2014 Lu .................. H01L 23/293
257/737

\* cited by examiner

*Primary Examiner* — Long Pham
(74) *Attorney, Agent, or Firm* — Hauptman Ham, LLP (57) ABSTRACT

A method of making a semiconductor device includes depositing a dielectric layer over a conductive pad using a first deposition process. The method further includes depositing a first passivation layer directly over the dielectric layer using a high density plasma chemical vapor deposition (HDPCVD). The first deposition process is different from HDPCVD. A thickness of the dielectric layer is sufficient to prevent charges generated by depositing the first passivation layer from reaching the conductive pad.

20 Claims, 5 Drawing Sheets

//  SEMICONDUCTOR DEVICE HAVING A PASSIVATION LAYER AND METHOD OF MAKING THE SAME

PRIORITY CLAIM

The instant application is a non-provisional application claiming priority to Provisional Application No. 62/434,243, filed Dec. 14, 2016, the entire content of which is incorporated by reference herein.

BACKGROUND

Conductive pads are located over a top of an interconnect structure in order to provide electrical connections to a separate die, package or interposer for forming a three-dimensional integrated circuit (3DIC). In order to reduce the risk of oxidation of the conductive pads, passivation layers are deposited over the conductive pads.

As technology nodes decrease, a pitch between conductive pads decreases. As a result, passivation layers having a higher degree of conformity, i.e., uniform thickness of the passivation layer, are used to protect the conductive pads. In some instances, the passivation layers are formed using a high density plasma chemical vapor deposition process (HDPCVD). HDPCVD generates charged particles and these charged particles are directed toward the conductive pads during deposition of the passivation layer over the conductive pads.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High density plasma chemical vapor deposition (HDP-CVD) generates charged particles during the formation of a passivation layer. In some instances, the charged particles accumulate in the passivation layer during the deposition process. These charged particles tend to accumulate at an interface between a conductive pad and the passivation layer. The charge from the charged particles is then able to travel from the conductive pad through an interconnect structure and damage an active component of the semiconductor device electrically connected to the conductive pad. For example, the charge damages a gate dielectric layer of a transistor, in some instances. This transfer of charges from the conductive pad to the active device is called an antenna effect, in some instances.

In order to reduce the risk of antenna effect, a dielectric layer which has few, if any, charged particles is formed directly over the conductive pad. This dielectric layer provides a barrier between the charged particles accumulated during HDPCVD and the conductive pad. The dielectric layer is deposited by a method having a lower conformity than HDPCVD. A lower conformity means that a thickness of the dielectric layer has a greater thickness variation along the layer in comparison with a layer deposited by HDPCVD. For example, in some instances, a thickness of the dielectric layer on sidewalls of the conductive pad is significantly less than a thickness of the dielectric layer over a top surface of the conductive pad. In contrast, a layer deposited by HDP-CVD will have a substantially equal thickness on the top surface of the conductive pad as on the sidewalls of the conductive pad.

Figure 1:
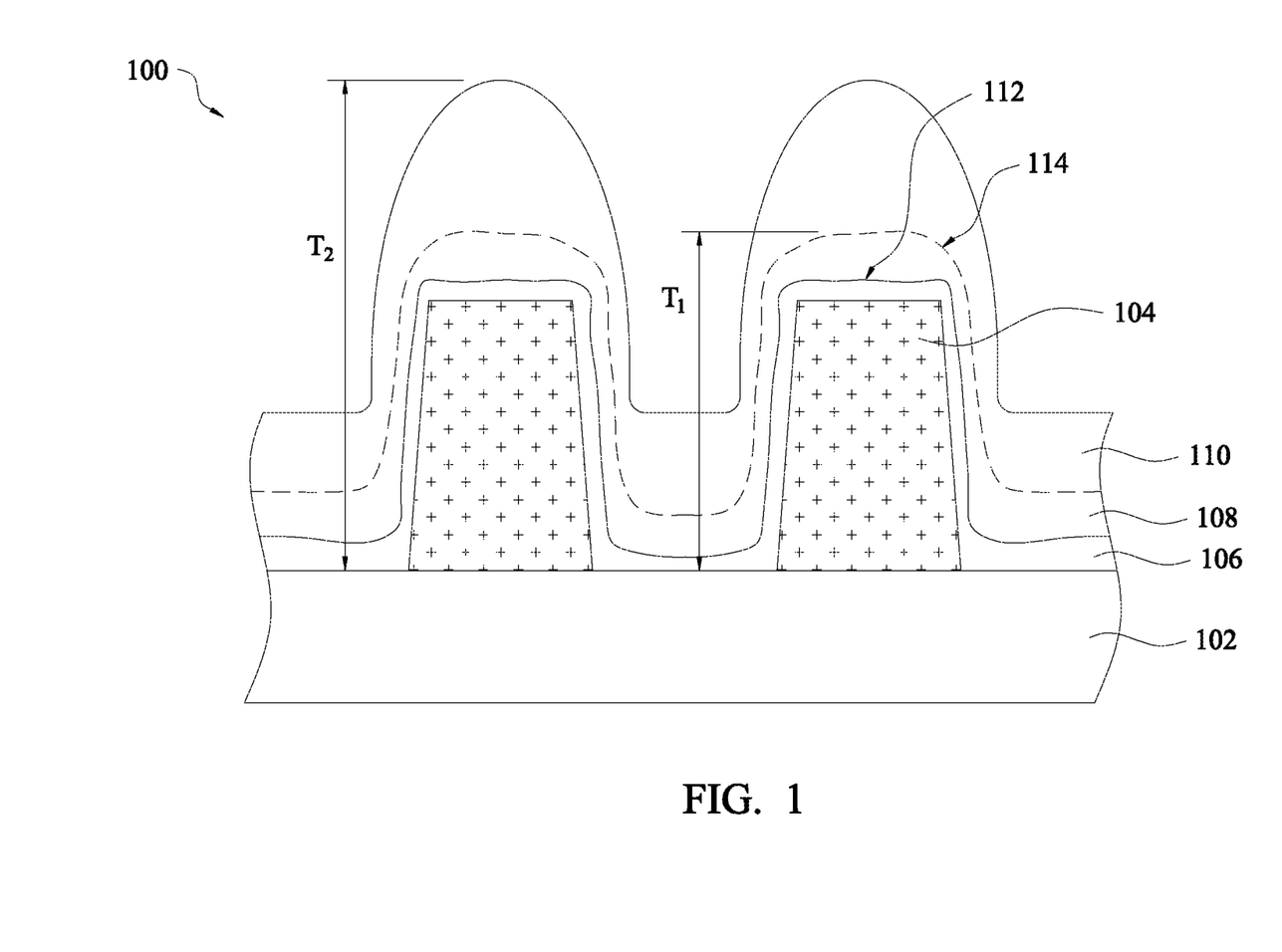
FIG. 1 is a cross-sectional view of a semiconductor device in accordance with some embodiments.

FIG. 1 is a cross-sectional view of a semiconductor device 100 in accordance with some embodiments. Semiconductor device includes an interconnect structure 102. Conductive pads 104 are over interconnect structure 102. At least one conductive pad 104 is electrically connected to conductive elements within interconnect structure 102. A dielectric layer 106 extends over a top surface of interconnect structure 102 and over conductive pads 104. A first passivation layer 108 is over dielectric layer 106. An interface 112 is defined between dielectric layer 106 and first passivation layer 108. A second passivation layer 110 is over first passivation layer 108; and an interface 114 is defined between second passivation layer 110 and first passivation layer 108. In some embodiments, first passivation layer 108 is omitted and second passivation layer 110 is directly over dielectric layer 106.

Dielectric layer 106 has a lower conformity than first passivation layer 108. In some embodiments, dielectric layer 106 has a lower conformity than second passivation layer 110. Dielectric layer 106 is deposited by a different deposition process from that used to deposit first passivation layer 108 and/or second passivation layer 110. Dielectric layer 106 is deposited using a deposition process which produces few, if any, charged particles in order to reduce the risk of antenna effect damaging active devices in semiconductor device 100 which are electrically connected to interconnect structure 102.

Interconnect structure 102 includes a plurality of conductive lines and conductive vias. A dielectric material surrounds the plurality of conductive lines and the plurality of conductive vias in order to reduce cross-talk and minimize resistance-capacitance (RC) delays in transferring signals through interconnect structure 102. In some embodiments, the plurality of conductive lines and the plurality of conductive vias include aluminum, copper, tungsten, gold or another suitable conductive material. In some embodiments, the dielectric material includes silicon oxide, silicon nitride, silicon oxynitride or another suitable dielectric material. In some embodiments, the plurality of conductive lines and the plurality of conductive vias are formed using a damascene process, such as a dual damascene process.

Conductive pads 104 are over interconnect structure 102. At least one conductive pad 104 is electrically connected to at least a portion of the plurality of conductive lines in interconnect structure 102. Conductive pads 104 each have sidewalls extending upward from the interconnect structure 102. A top surface of conductive pads 104 extends between the sidewalls. In some embodiments, the sidewalls are substantially perpendicular to a top surface of interconnect structure 102. In some embodiments, the sidewalls form an obtuse or acute angle with respect to the top surface of interconnect structure 102 such that a width of conductive pads 104 varies in relation to a distance from interconnect structure 102. In some embodiments, the sidewalls and/or top surface of conductive pads 104 are at least partially curved.

In some embodiments, at least one conductive pad 104 is a dummy conductive pad which is electrically separated from all of the plurality conductive lines and the plurality of conductive vias. The dummy conductive pad helps with uniform formation of conductive pads 104. In some embodiments, conductive pads 104 include aluminum, copper, aluminum-copper alloy, tungsten, gold or another suitable conductive material. In some embodiments, conducive pads 104 include a same material as the plurality of conductive lines and the plurality of conductive vias. In some embodiments, conductive pads 104 include a different material from the plurality of conductive lines and the plurality of conductive vias.

In some embodiments, conductive pads 104 are formed by a blanket deposition of conductive material followed by a photolithography/etching process in order to define distinct conductive pads 104. Conductive pads 104 are spaced from each other by a first pitch. A value of the first pitch depends on a technology node of semiconductor device 100. As a technology node of semiconductor device 100 decreases, the first pitch also decreases.

Dielectric layer 106 is over conducive pads 104 and interconnect structure 102. Dielectric layer 106 is a continuous layer. Dielectric layer 106 provides an electrically insulating barrier around conductive pads 104. Dielectric layer 106 is deposited by a process which generates few, if any, charged particles. In some embodiments, dielectric layer 106 is deposited using plasma enhanced chemical vapor deposition (PECVD), low pressure chemical vapor deposition (LPCVD), atmospheric pressure chemical vapor deposition (APCVD), atomic layer deposition (ALD) or another suitable deposition process. In some embodiments, dielectric layer 106 includes silicon oxide, silicon nitride, silicon oxynitride or another suitable dielectric material.

A thickness of dielectric layer 106 ranges from about 1 angstrom (Å) to about 15,000 Å. A thickness of dielectric layer 106 is selected based on an amount of charge accumulation expected during deposition of first passivation layer 106. As an amount of charge accumulation expected during deposition of first passivation layer 106 increases, the thickness of dielectric layer 106 increases. In some embodiments where first passivation layer 106 is omitted, the thickness of dielectric layer 106 ranges from about 200 Å to about 15,000 Å. The increased minimum thickness of dielectric layer 106 for some embodiments without first passivation layer 106 is because dielectric layer 106 is relied upon to provide passivation protection for conductive pads 104.

Dielectric layer 106 has a lower conformity, i.e., increased thickness variation, in comparison with first passivation layer 108. In some embodiments, the thickness of dielectric layer 106 over sidewalls of conductive pads 104 differs from the thickness of dielectric layer 106 over the top surface of conductive pads 104 by about 5% to about 10%. This thickness variation is a result of using a deposition process which has a lower conformity.

First passivation layer 108 is over dielectric layer 106 and provides protection to prevent oxidation of conductive pads 104. First passivation layer 108 is deposited using HDP-CVD. Depositing first passivation layer 108 using HDPCVD results in charged particles accumulating in first passivation layer 108. Dielectric layer 106 acts as an electrical barrier to prevent or reducing charges from the charged particles from reaching conductive pads 104. By reducing or preventing charges from reaching conductive pads 104, the impact of the antenna effect damaging active devices in semiconductor device 100 is reduced or eliminated.

In some embodiments, first passivation layer 108 includes silicon oxide, silicon nitride, silicon oxynitride or another suitable dielectric material. In some embodiments, first passivation layer 108 includes a same material as dielectric layer 106. In some embodiments, first passivation layer 108 includes a different material from dielectric layer 106. Even in embodiments where first passivation layer 108 includes a same material as dielectric layer 106, interface 112 exists because first passivation layer 108 and dielectric layer 106 are deposited in a sequential manner, i.e., one layer is deposited before another layer. Bonds within the material of each of first passivation layer 108 and dielectric layer 106 do not extend across interface 112. Therefore, even in embodiments where first passivation layer 108 and dielectric layer 106 are a same material, the layers remain distinguishable from one another.

A thickness of first passivation layer 108 ranges from about 200 Å to about 15,000 Å. As the thickness of first passivation layer 108 increases, protection from oxidation for conductive pads 104 increases. In some embodiments, a total thickness $T_1$ of conductive pad 104, dielectric layer 106 and first passivation layer 108 ranges from about 25,000 Å to about 30,000 Å. In some embodiments, total thickness $T_1$ is about 28,000 Å.

First passivation layer 108 has a higher conformity in comparison with dielectric layer 106. In some embodiments, the thickness of first passivation layer 108 over sidewalls of conductive pads 104 differs from the thickness of first passivation layer 108 over the top surface of conductive pads 104 by less than about 3%.

In some embodiments, first passivation layer 108 is omitted. First passivation layer 108 is omitted in some embodiments where a thickness of dielectric layer 106 is sufficient to provide oxidation protection for conductive pads 104.

Second passivation layer 110 is over first passivation layer 108 and provides protection to prevent oxidation of conductive pads 104. In some embodiments, second passivation layer 110 is deposited using HDPCVD. In some embodiments, second passivation layer 110 is deposited using LPCVD, APCVD, PECVD, ALD or another suitable deposition process. Second passivation layer 110 includes a different material from first passivation layer 108. In some embodiments, second passivation layer 110 includes silicon oxide, silicon nitride, silicon oxynitride or another suitable dielectric material. In some embodiments, second passivation layer 110 includes a same material as dielectric layer 106. In some embodiments, second passivation layer 110 includes a different material from dielectric layer 106. Interface 114 exists between first passivation layer 108 and second passivation layer 110

A thickness of second passivation layer 110 ranges from about 200 Å to about 9,000 Å. As the thickness of second passivation layer 110 increases, protection from oxidation for conductive pads 104 increases. In some embodiments, a total thickness $T_2$ of conductive pad 104, dielectric layer 106, first passivation layer 108 and second passivation layer 110 ranges from about 30,000 Å to about 40,000 Å. In some embodiments, total thickness $T_2$ is about 35,000 Å.

In some embodiments, second passivation layer 110 has a higher conformity in comparison with dielectric layer 106. In some embodiments, the thickness of second passivation layer 110 over sidewalls of conductive pads 104 differs from the thickness of second passivation layer 110 over the top surface of conductive pads 104 by less than about 3%.

In some embodiments where first passivation layer 108 is omitted, second passivation layer 110 directly contacts dielectric layer 106. In embodiments where first passivation layer 108 is omitted, second passivation layer 110 has a different material from dielectric layer 106.

Figure 2:
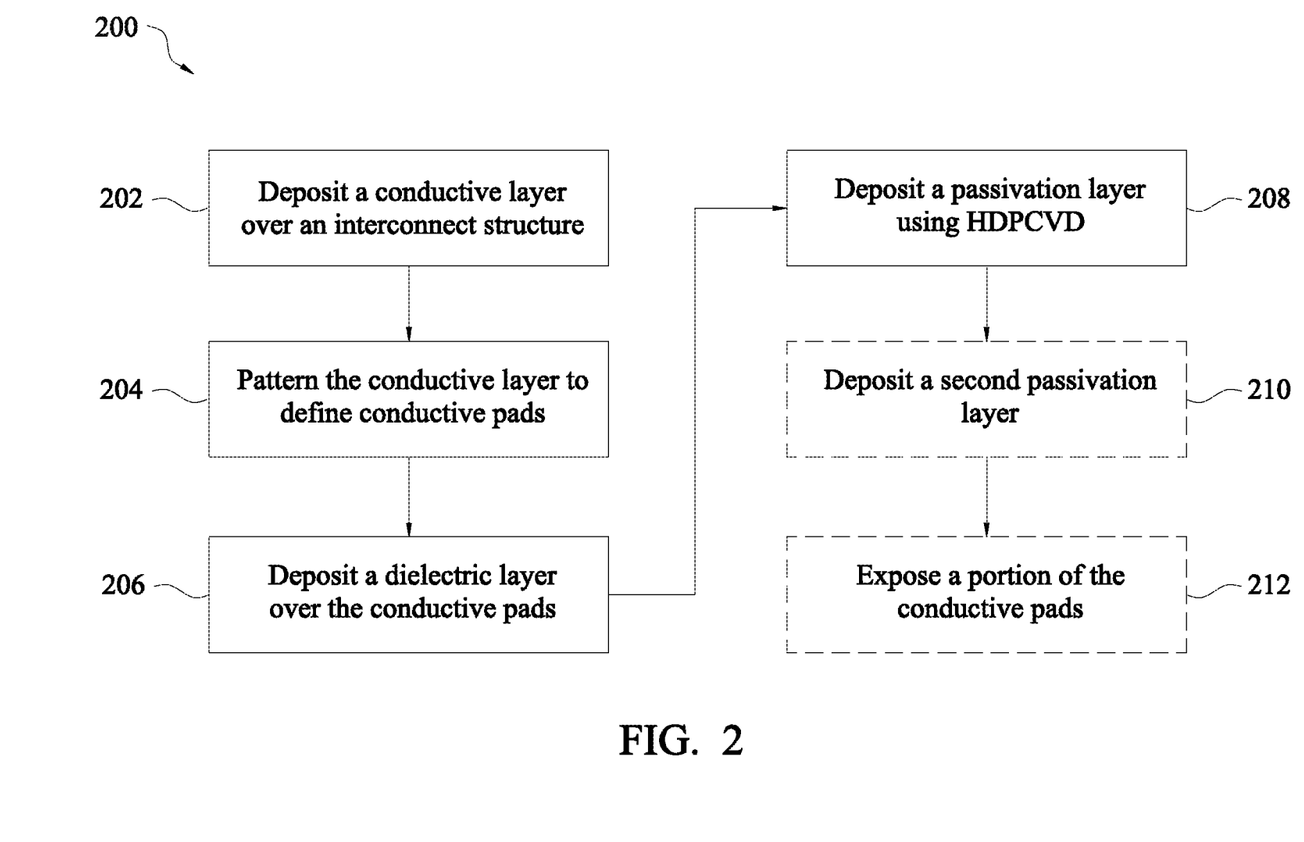
FIG. 2 is a flow chart of a method of making a semiconductor device in accordance with some embodiments.

FIG. 2 is a flow chart of a method 200 of making a semiconductor device in accordance with some embodiments. In some embodiments, method 200 is usable to form semiconductor device 100 (FIG. 1). In operation 202, a conductive layer is deposited over an interconnect structure. In some embodiments, the conductive layer is a conductive pad. In some embodiments, the conductive layer is a redistribution line (RDL). The interconnect structure provides electrical connections between different active devices. In some embodiments, the active devices are on a same die or package as the interconnect structure. In some embodiments, the interconnect structure is on an interposer or another die or package separate from the active devices. In some embodiments, the interconnect structure is interconnect structure 102 (FIG. 1).

The conductive layer is deposited by a blanket deposition process. In some embodiments, the blanket deposition process includes sputtering, physical vapor deposition (PVD), electroplating, electroless plating or another suitable deposition process. In some embodiments, the conductive layer is deposited directly on the interconnect structure. In some embodiments, an intervening layer is present between the conductive layer and the interconnect structure. In some embodiments, the conductive layer includes aluminum, copper, tungsten, gold or another suitable conductive material.

In operation 204, the conductive layer is patterned to define conductive pads. In some embodiments, the conductive pads are conductive pads 104 (FIG. 1). In some embodiments, the conductive layer is patterned using a photolithography/etching process. In some embodiments, a hard mask layer is deposited over the conductive layer during the patterning process.

In some embodiments, the hard mask layer is deposited over the conductive layer. In some embodiments, the hard mask layer is deposited using PVD, chemical vapor deposition (CVD) or another suitable deposition process. In some embodiments, the hard mask layer is omitted. A hard mask layer helps to improve precision of the patterning process, but increases production costs.

A photoresist layer is deposited over the hard mask layer. In some embodiments where the hard mask layer is omitted, the photoresist layer is deposited directly on the conductive layer. In some embodiments, the photoresist layer is a positive photoresist. In some embodiments, the photoresist layer is a negative photoresist. The photoresist layer is exposed to a patterned light beam. A light beam is generated by a light source and passes through at least one photomask in order to form the patterned light beam. The photoresist layer is then developed and portions of the photoresist layer are removed based on the exposure to the patterned light beam. In some embodiments including the hard mask layer, the hard mask layer is etched using the photoresist layer as a mask to define which portions of the hard mask layer to remove.

The conductive layer is then etched using the hard mask layer and/or the photoresist layer as a mask for protecting portions of the conductive layer. The etching process removes portions of the conductive layer exposed by the hard mask layer and/or the photoresist layer. In some embodiments, the etching process includes a wet etching process. In some embodiments, the etching process includes a dry etching process. In some embodiments, a cleaning process is performed after the etching process in order to remove residue and by-product materials.

In operation 206, a dielectric layer is deposited over the conductive pads. The dielectric layer is a continuous layer extending over the conductive pads and the interconnect structure. In some embodiments, the dielectric layer is dielectric layer 106 (FIG. 1). In some embodiments, depositing the dielectric layer includes depositing silicon oxide, silicon nitride, silicon oxynitride or another suitable dielectric material. The dielectric layer is deposited using a deposition process which generates few, if any, charged particles. In some embodiments, the dielectric layer is deposited using LPCVD, APCVD, PECVD, ALD or another suitable deposition process.

A thickness of the dielectric layer is determined based on an expected amount of charged particles accumulated during a subsequent deposition process. In some embodiments, the thickness of the dielectric layer ranges from about 1 Å to about 15,000 Å. In some embodiments, the thickness of the dielectric layer ranges from about 200 Å to about 15,000 Å.

In operation 208, a passivation layer is deposited using HPDCVD. The passivation layer is deposited on the dielectric layer. In some embodiments, the passivation layer is first passivation layer 108 (FIG. 1). In some embodiments, the passivation layer is second passivation layer 110. Depositing the passivation layer using HDPCVD results in charged particles accumulating in the passivation layer. The dielectric layer prevents or reduces charges from the charged particles from reaching the conductive pads and, as a result, reduces or prevents the impact of the antenna effect. Depositing the passivation layer using HDPCVD results in the passivation layer having a higher degree of conformity in comparison with the dielectric layer.

In some embodiments, depositing the passivation layer includes depositing silicon oxide, silicon nitride, silicon oxynitride or another suitable dielectric material. In some embodiments, the passivation layer includes a same material as the dielectric layer. In some embodiments, the passivation layer includes a different material from the dielectric layer. An interface between the dielectric layer and the passivation layer exists regardless of a material of the passivation layer.

In some embodiments, a thickness of the passivation layer ranges from about 200 Å to about 15,000 Å. In some embodiments, the thickness of the passivation layer ranges from about 200 Å to about 9,000 Å. In some embodiments, the thickness of the passivation layer is selected based on a thickness of the dielectric layer. For example, in some embodiments, a total thickness of the conductive pad, the dielectric layer and the passivation layer ranges from about 25,000 Å to about 30,000 Å. In some embodiments, a total thickness of the conductive pad, the dielectric layer and the passivation layer ranges from about 30,000 Å to about 40,000 Å.

In optional operation 210, a second passivation layer is deposited. The second passivation layer is deposited over the passivation layer formed in operation 208. In some embodiments, the second passivation layer is deposited using HPDCVD. In some embodiments, the second passivation layer is deposited using LPCVD, APCVD, PECVD, ALD or another suitable deposition process. In some embodiments, the passivation layer is second passivation layer 110 (FIG. 1). In some embodiments, the second passivation layer has a higher degree of conformity in comparison with the dielectric layer.

The second passivation layer has a different material from the passivation layer deposited in operation 208. In some embodiments, depositing the second passivation layer includes depositing silicon oxide, silicon nitride, silicon oxynitride or another suitable dielectric material. In some embodiments, the second passivation layer includes a same material as the dielectric layer. In some embodiments, the second passivation layer includes a different material from the dielectric layer.

In some embodiments, a thickness of the second passivation layer ranges from about 200 Å to about 9,000 Å. In some embodiments, a total thickness of the conductive pad, the dielectric layer, the first passivation layer and the second passivation layer ranges from about 30,000 Å to about 40,000 Å.

In some embodiments, operation 210 is omitted if the thickness of the dielectric layer is sufficient to provide passivation protection for the conductive pads. For example, in some embodiments, operation 210 is omitted if the thickness of the dielectric layer is greater than or equal to about 200 Å.

In optional operation 212, a portion of the conductive pads is exposed. In some embodiments, the portion of the conductive pads exposed is limited to the top surface of the conductive pads. In some embodiments, the portion of the conductive pads exposed includes the top surface and a portion of the sidewalls of the conductive pads. Exposing a portion of the sidewalls of the conductive pads provides a greater area for signal transfer in a 3DIC, which reduces resistance. However, increasing the portion of the conductive pads which is exposed also increases a risk of damage to the conductive pads.

In some embodiments, the portion of the conductive pads is exposed using a chemical mechanical planarization (CMP) process. In some embodiments, the portion of the conductive pads is exposed using an etching process. In some embodiments, the etching process is a wet etching process. In some embodiments, the etching process is a dry etching process. In some embodiments, the portion of the conductive pads is exposed using a combination of a CMP process and an etching process. For example, in some embodiments, a CMP process is used to expose the top surface of the conductive pads, then an etching process is used to expose portions of the sidewalls of the conductive pads.

Figure 3A:
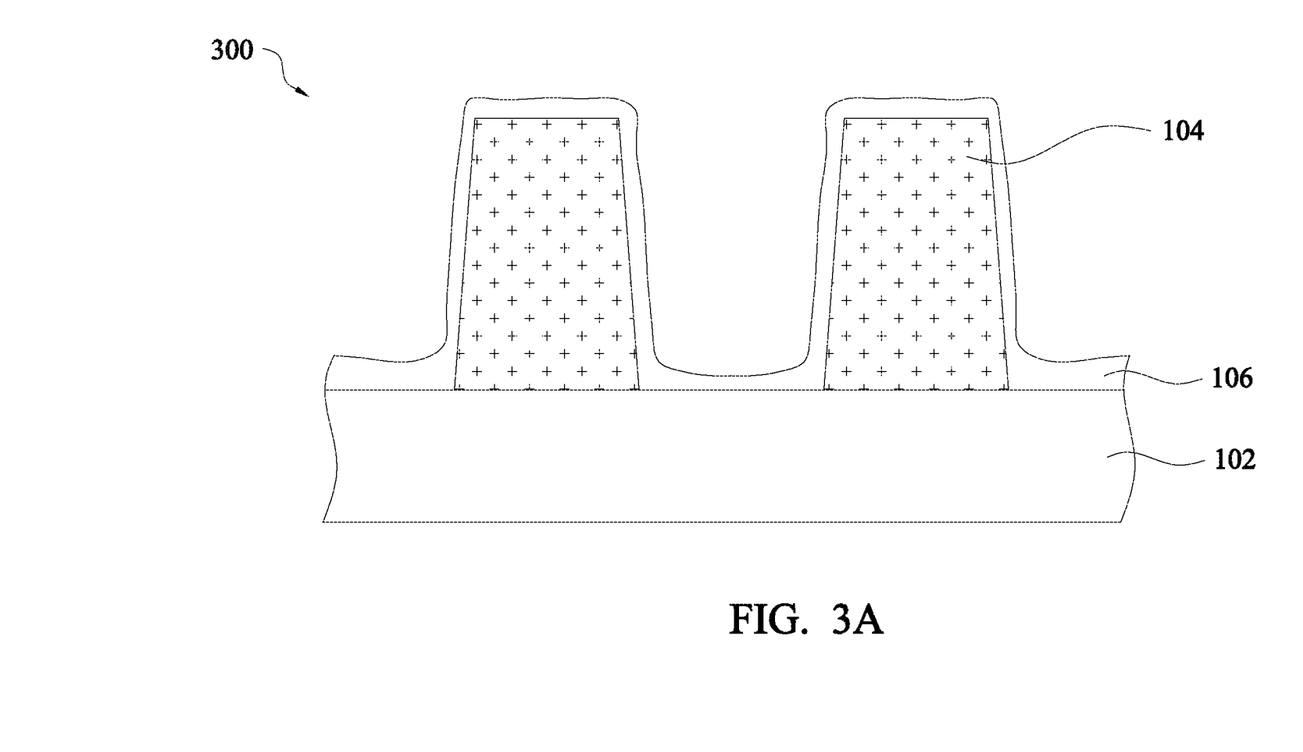
FIGS. 3A-3C are cross-sectional views of a semiconductor device during various stages of manufacture in accordance with some embodiments.

FIG. 3A is a cross-sectional view of a semiconductor device 300 following deposition of dielectric layer 106 in accordance with some embodiments. Semiconductor device 300 is similar to semiconductor device 100 and same elements have a same reference number. In semiconductor device 300, dielectric layer 106 is a continuous layer covering conductive pads 104 and a surface of interconnect structure 102 between conductive pads 104.

Figure 3B:
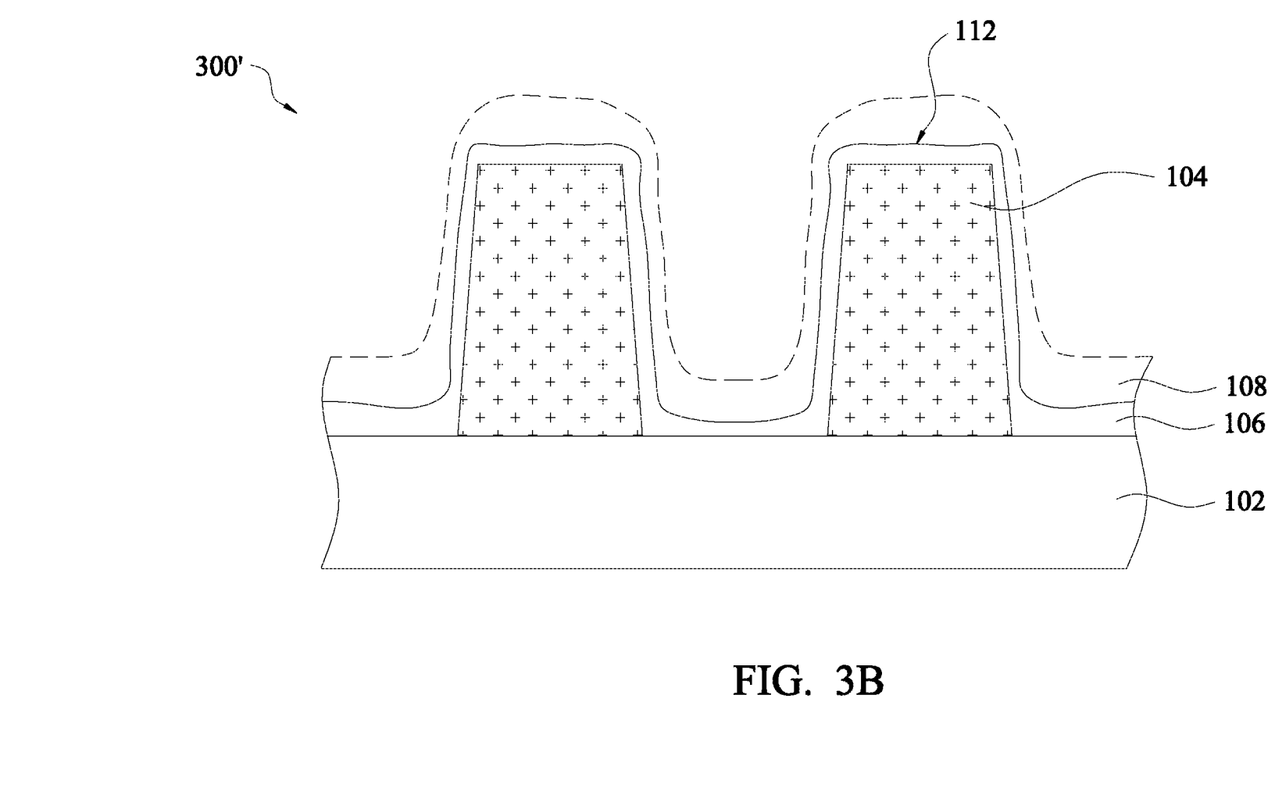

FIG. 3B is a cross-sectional view of a semiconductor device 300' following deposition of first passivation layer 108 in accordance with some embodiments. Semiconductor device 300' is similar to semiconductor device 300 and semiconductor device 100 and same elements have a same reference number. In comparison with semiconductor device 300, semiconductor device 300' includes first passivation layer 108 over dielectric layer 106. First passivation layer 108 is deposited by HDPCVD. The HDPCVD process uses charged particles of a material of first passivation layer 108 in order to form the first passivation layer 108. The charges of these charged particles in first passivation layer 108 migrate through first passivation layer 108 and tend to accumulate at lattice defects and interfaces, such as interface 112.

Dielectric layer 106 functions as barrier layer to prevent the accumulated charges at interface 112 from reaching conductive pads 104. Since the amount of charge reaching conductive pads 104 is reduced or eliminated, an antenna effect which potentially damages active devices of semiconductor device 300' is reduced.

Figure 3C:
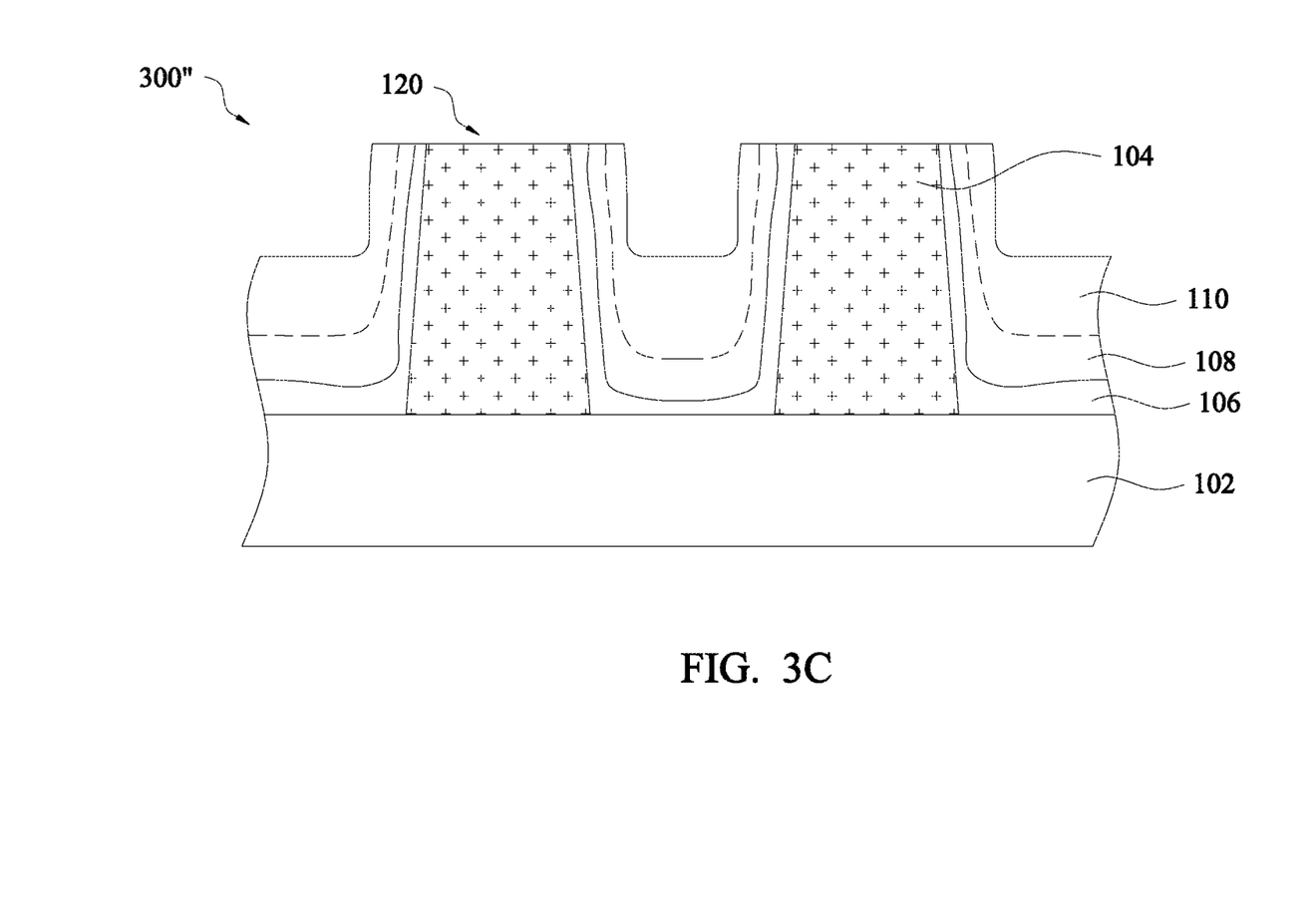

FIG. 3C is a cross-sectional view of a semiconductor device 300" following exposure of a portion of conductive pads 104. Semiconductor device 300" is similar to semiconductor device 300', semiconductor device 300 and semiconductor device 100 and same elements have a same reference number. In comparison with semiconductor device 100, semiconductor device 300" includes a top surface 120 of conductive pads 104 exposed. In some embodiments, top surface 120 of conductive pads 104 is exposed by a CMP process or an etching process. Dielectric layer 106 remains between first passivation layer 108 and conductive pads 104 in order to maintain the electrical insulation to reduce or avoid the antenna effect. In some embodiments, a polymer layer is deposited over semiconductor device 300" prior to a CMP process.

One aspect of this description relates to a method of making a semiconductor device. The method includes depositing a dielectric layer over a conductive pad using a first deposition process. The method further includes depositing a first passivation layer directly over the dielectric layer using a high density plasma chemical vapor deposition (HDPCVD). The first deposition process is different from HDPCVD. A thickness of the dielectric layer is sufficient to prevent charges generated by depositing the first passivation layer from reaching the conductive pad.

Another aspect of this description relates to a method of making a semiconductor device. The method includes depositing a dielectric layer over a conductive pad using a first deposition process. The method further includes depositing a first passivation layer directly over the dielectric layer using a high density plasma chemical vapor deposition (HDPCVD). The first deposition process is different from HDPCVD. A material of the first passivation layer is a same material as the dielectric layer. The method further includes depositing a second passivation layer over the first passivation layer, wherein a material of the second passivation layer is different from the first passivation layer.

Still another aspect of this description relates to a semiconductor device. The semiconductor device includes a conductive pad over an interconnect structure, wherein the conductive pad is electrically connected to an active device. The semiconductor device further includes a dielectric layer over the conductive pad, wherein the dielectric layer comprises silicon oxide. The semiconductor device further includes a first passivation layer directly over the dielectric layer, wherein the first passivation layer comprises silicon oxide. The semiconductor device further includes a second passivation layer directly over the first passivation layer, wherein the second passivation layer comprises silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
    depositing a dielectric layer over a conductive pad using a first deposition process; and
    depositing a first passivation layer directly over the dielectric layer using a high density plasma chemical vapor deposition (HDPCVD), wherein the first deposition process is different from HDPCVD, and a thickness of the dielectric layer is sufficient to prevent charges generated by depositing the first passivation layer from reaching the conductive pad.

2. The method of claim 1, wherein the first deposition process comprises low pressure chemical vapor deposition (LPCVD), atmospheric pressure chemical vapor deposition (APCVD) or plasma enhanced chemical vapor deposition (PECVD).

3. The method of claim 1, wherein depositing the first passivation layer comprises depositing the first passivation layer comprising a same material as the dielectric layer.

4. The method of claim 1, further comprising depositing a second passivation layer over the first passivation layer, wherein the second passivation layer comprises a different material from the first passivation layer.

5. The method of claim 4, wherein depositing the second passivation layer comprises depositing the second passivation layer using HDPCVD.

6. The method of claim 4, wherein depositing the second passivation layer comprises depositing the second passivation layer using LPCVD, APCVD, PECVD or ALD.

7. The method of claim 4, wherein depositing the second passivation layer comprises depositing the second passivation layer comprising a different material from the dielectric layer.

8. The method of claim 4, wherein depositing the second passivation layer comprises depositing the second passivation layer comprising a same material as the dielectric layer.

9. The method of claim 1, wherein depositing the dielectric layer comprises depositing the dielectric layer having a lower conformity than the first passivation layer.

10. The method of claim 1, further comprising exposing a portion of the conductive pad.

11. A method of making a semiconductor device, the method comprising:
    depositing a dielectric layer over a conductive pad using a first deposition process;
    depositing a first passivation layer directly over the dielectric layer using a high density plasma chemical vapor deposition (HDPCVD), wherein the first deposition process is different from HDPCVD, and a material of the first passivation layer is a same material as the dielectric layer; and
    depositing a second passivation layer over the first passivation layer, wherein a material of the second passivation layer is different from the material of the first passivation layer.

12. The method of claim 11, wherein the first deposition process comprises low pressure chemical vapor deposition (LPCVD), atmospheric pressure chemical vapor deposition (APCVD), plasma enhanced chemical vapor deposition (PECVD) or atomic layer deposition (ALD).

13. The method of claim 11, wherein depositing the second passivation layer comprises depositing the second passivation layer using LPCVD, APCVD, PECVD or ALD.

14. The method of claim 11, wherein depositing the second passivation layer comprises depositing the second passivation layer using HDPCVD.

15. The method of claim 11, wherein depositing the dielectric layer comprises depositing silicon oxide.

16. The method of claim 11, wherein depositing the second passivation layer comprises depositing silicon nitride.

17. The method of claim 11, further comprising exposing a portion of the conductive pad using at least one of chemical mechanical planarization (CMP) or etching.

18. The method of claim 17, wherein exposing the portion of the conductive pad comprises exposing only a top surface of the conductive pad.

19. A method of making a semiconductor device, the method comprising:
    forming a plurality of conductive pads on an interconnect structure;
    depositing a dielectric layer over the plurality of conductive pads using a first deposition process, wherein the dielectric layer comprises a first material;
    depositing a first passivation layer directly over the dielectric layer using a high density plasma chemical vapor deposition (HDPCVD), wherein the first deposition process is different from HDPCVD, and the first passivation layer comprises the first material; and
    depositing a second passivation layer over the first passivation layer, wherein the second passivation layer comprises a second material different from the first material.

20. The method of claim 19, wherein the depositing of the dielectric layer comprises depositing the dielectric layer directly on the interconnect structure between adjacent conductive pads of the plurality of conductive pads.

* * * * *